US012349582B2

(12) United States Patent
Song et al.

(10) Patent No.: US 12,349,582 B2
(45) Date of Patent: Jul. 1, 2025

(54) DISPLAY DEVICE

(71) Applicant: Samsung Display Co., LTD., Yongin-si (KR)

(72) Inventors: Hyun Gue Song, Hwaseong-si (KR); Hyun Ho Jung, Hwaseong-si (KR); Chul Hyun Choi, Cheonan-si (KR); Hee Seong Jeong, Suwon-si (KR); Sang Min Hong, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 577 days.

(21) Appl. No.: 17/586,223

(22) Filed: Jan. 27, 2022

(65) Prior Publication Data
US 2022/0246882 A1 Aug. 4, 2022

(30) Foreign Application Priority Data
Feb. 1, 2021 (KR) .......................... 10-2021-0014189

(51) Int. Cl.
H10K 59/80 (2023.01)
H10K 50/844 (2023.01)
H10K 50/858 (2023.01)
H10K 59/12 (2023.01)

(52) U.S. Cl.
CPC ......... H10K 59/879 (2023.02); H10K 50/844 (2023.02); H10K 50/858 (2023.02); H10K 59/8731 (2023.02); H10K 59/12 (2023.02)

(58) Field of Classification Search
CPC ............... H10K 50/844; H10K 59/873; H10K 50/8445; H10K 59/8731; H10K 50/858; H10K 59/879
See application file for complete search history.

(56) References Cited

U.S. PATENT DOCUMENTS

| 10,069,102 B2 * | 9/2018 | Lee .................... H10K 50/858 |
| 10,483,484 B2 | 11/2019 | Lee |
| 10,720,596 B2 | 7/2020 | Cho et al. |
| 2014/0070187 A1 * | 3/2014 | Cho .................... H10K 50/8445 |
| | | 257/40 |

(Continued)

FOREIGN PATENT DOCUMENTS

| KR | 10-2014-0033867 A | 3/2014 |
| KR | 2015-0066431 A | 6/2015 |

(Continued)

Primary Examiner — Alia Sabur
(74) Attorney, Agent, or Firm — Womble Bond Dickinson (US) LLP

(57) ABSTRACT

A display device includes: a substrate; a display element on the substrate; a capping layer on the display element; a first auxiliary layer on the capping layer; and a thin-film encapsulation layer on the first auxiliary layer, wherein the thin-film encapsulation layer comprises a (1-1)-th inorganic encapsulation layer on the first auxiliary layer and a (1-2)-th inorganic encapsulation layer on the (1-1)-th inorganic encapsulation layer, wherein a refractive index of the first auxiliary layer is smaller than a refractive index of the capping layer and a refractive index of the (1-1)-th inorganic encapsulation layer, and a refractive index of the (1-2)-th inorganic encapsulation layer is smaller than the refractive index of the (1-1)-th inorganic encapsulation layer.

27 Claims, 20 Drawing Sheets

(56) References Cited

U.S. PATENT DOCUMENTS

| | | | | |
|---|---|---|---|---|
| 2014/0138636 A1* | 5/2014 | Song | ................... | H10K 50/844 |
| | | | | 257/40 |
| 2015/0137081 A1* | 5/2015 | Kim | ...................... | H10K 59/35 |
| | | | | 257/40 |
| 2016/0197308 A1* | 7/2016 | Jeong | .................. | H10K 50/852 |
| | | | | 257/40 |
| 2016/0329521 A1* | 11/2016 | Kim | ................... | H10K 50/858 |
| 2016/0380235 A1* | 12/2016 | Kim | .................. | H10K 85/6576 |
| | | | | 257/40 |
| 2017/0373277 A1* | 12/2017 | Noh | ...................... | H10K 50/81 |
| 2018/0019439 A1* | 1/2018 | Lee | ................... | H10K 59/1213 |
| 2018/0130858 A1* | 5/2018 | Kim | .................. | H10K 50/858 |
| 2019/0043931 A1* | 2/2019 | Yim | ................... | H10K 59/879 |
| 2019/0131378 A1* | 5/2019 | Sung | ................... | H10K 59/879 |
| 2019/0245010 A1 | 8/2019 | Benoit et al. | | |
| 2020/0381665 A1 | 12/2020 | Song et al. | | |
| 2020/0411797 A1 | 12/2020 | Song et al. | | |
| 2021/0305537 A1 | 9/2021 | Song et al. | | |

FOREIGN PATENT DOCUMENTS

| | | |
|---|---|---|
| KR | 2016-0036722 A | 4/2016 |
| KR | 2018-0001982 A | 1/2018 |
| KR | 10-2018-0016694 A | 2/2018 |
| KR | 2019-0076090 A | 7/2019 |
| KR | 2019-0076615 A | 7/2019 |
| KR | 2019-0136692 A | 12/2019 |

\* cited by examiner

DISPLAY DEVICE

CROSS-REFERENCE TO RELATED APPLICATION

The present application claims priority to and the benefit of Korean Patent Application No. 10-2021-0014189, filed on Feb. 1, 2021, in the Korean Intellectual Property Office, the entire disclosure of which is incorporated herein by reference.

BACKGROUND

1. Field

Aspects of some embodiments of the present disclosure relate to a display device.

2. Description of the Related Art

In recent years, the various uses and applications for display devices have become more diversified. In addition, as display devices have become more thin and lightweight, the scope of their uses has also expanded, and research is being continuously conducted on display devices that can be utilized in various fields.

Display elements included in a display device emit light (e.g., having a set or predetermined color) to display images. Here, the emitted light may pass through an encapsulation member for sealing the display elements. When the encapsulation member has a structure in which a plurality of layers are stacked, light emitted from the display elements may be interfered with by layer thicknesses of the encapsulation member.

The above information disclosed in this Background section is only for enhancement of understanding of the background and therefore the information discussed in this Background section does not necessarily constitute prior art.

SUMMARY

Aspects of some embodiments of the present disclosure include a display device that may be capable of reducing the amount of movement in the overall color temperature direction by adjusting magnitudes of refractive indices of a capping layer, a first auxiliary layer, and a plurality of layers of a first inorganic encapsulation layer.

However, aspects of embodiments according to the present disclosure are not restricted to the one set forth herein. The above and other aspects of embodiments according to the present disclosure will become more apparent to one of ordinary skill in the art to which the present disclosure pertains by referencing the detailed description of the present disclosure given below.

According to some embodiments of the present disclosure, a display device includes: a substrate; a display element on the substrate; a capping layer on the display element; a first auxiliary layer on the capping layer; and a thin-film encapsulation layer on the first auxiliary layer, wherein the thin-film encapsulation layer comprises a (1-1)-th inorganic encapsulation layer on the first auxiliary layer and a (1-2)-th inorganic encapsulation layer on the (1-1)-th inorganic encapsulation layer, wherein a refractive index of the first auxiliary layer is smaller than each of a refractive index of the capping layer and a refractive index of the (1-1)-th inorganic encapsulation layer, and a refractive index of the (1-2)-th inorganic encapsulation layer is smaller than the refractive index of the (1-1)-th inorganic encapsulation layer.

According to some embodiments of the present disclosure, a display device includes: a substrate; a display element on the substrate; a capping layer on the display element; a first auxiliary layer on the capping layer; and a thin-film encapsulation layer on the first quxiliary layer, wherein the thin-film encapsulation layer comprises a first inorganic encapsulation layer, a second inorganic encapsulation layer, and an organic encapsulation layer between the first inorganic encapsulation layer and the second inorganic encapsulation layer, wherein the first inorganic encapsulation layer comprises one or more layers, and refractive indices of the capping layer, the first auxiliary layer, and the layers of the first inorganic encapsulation layer are alternately high and low.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
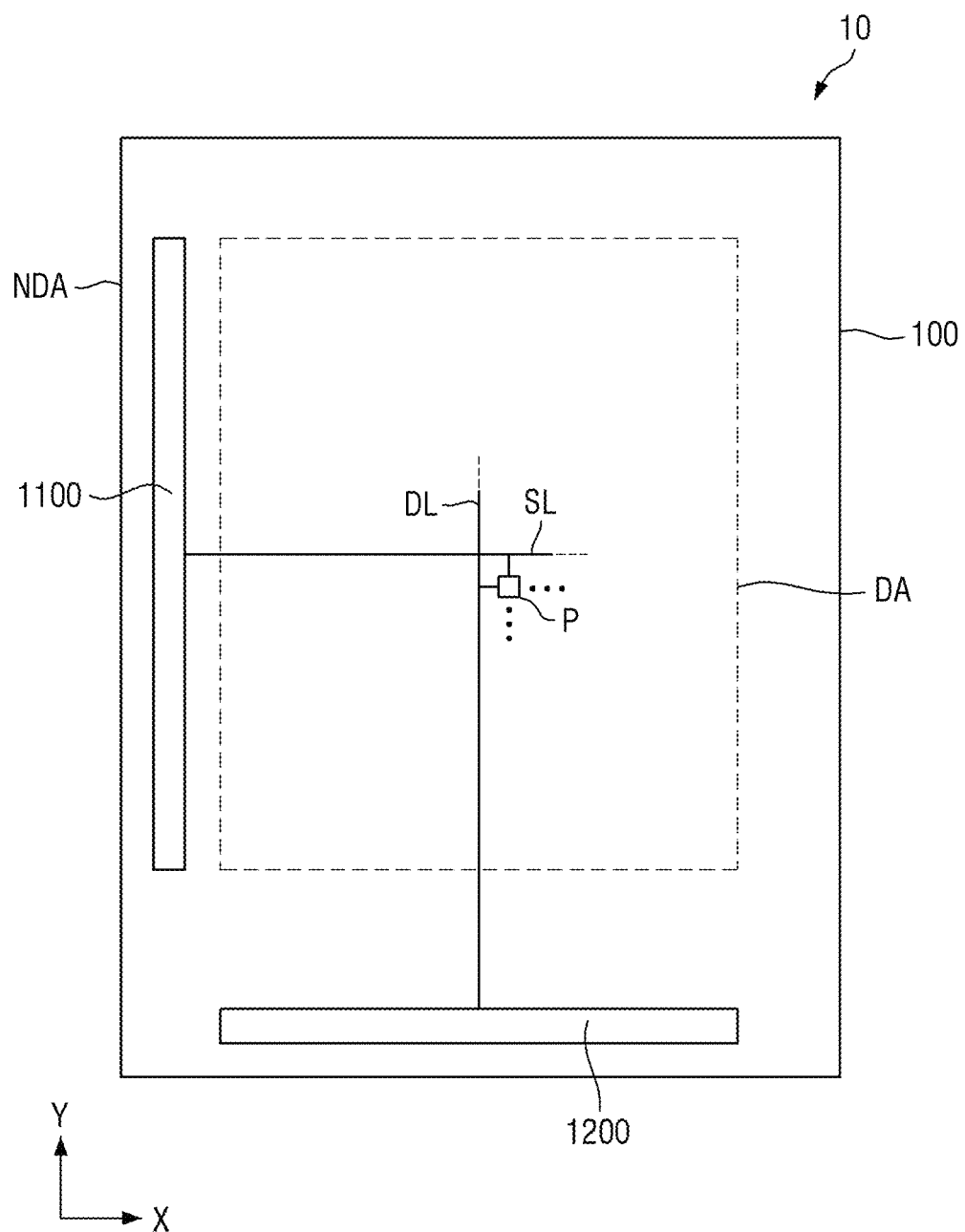
FIG. 1 is a schematic plan view of a display device according to some embodiments.

Although various modifications can be made to embodiments according to the present disclosure and the present disclosure may have various embodiments, specific embodiments will be illustrated and explained in more detail below. Effects and features of embodiments according to the present disclosure and methods of accomplishing the same may be understood more readily by reference to the following detailed description of example embodiments and the accompanying drawings. Embodiments according to the present disclosure may, however, be embodied in many different forms and should not be construed as being limited to the embodiments set forth herein.

Hereinafter, aspects of some embodiments of the present disclosure will be described in more detail with reference to the accompanying drawings. In the following description with reference to the drawings, the same or corresponding elements will be given the same reference numerals, and a redundant description thereof will be omitted.

In the following embodiments, the terms first, second, etc., are only used to distinguish one element from another element and not used to limit the elements.

In the following embodiments, the singular forms "a", "an" and "the" are intended to include the plural forms as well, unless the context clearly indicates otherwise.

In the following embodiments, the terms "includes" or "has," when used in this specification, specify the presence of stated features or elements, but do not preclude the presence or addition of one or more other features or elements.

In the following embodiments, when a part such as a layer, an area or an element is referred to as being "on" another part, the part can be directly on the other part or intervening layers, areas or elements.

In the drawings, sizes of elements may be exaggerated or reduced for ease of description. For example, because the size and thickness of each element in the drawings are arbitrarily illustrated for ease of description, the present disclosure is not necessarily limited to the illustrated size and thickness.

In a case where an embodiment can be implemented in an alternative way, specific processes may be performed in an order different from the order described. For example, two processes described in succession may be performed substantially simultaneously or may be performed in an order opposite to the order described.

In the following embodiments, when a layer, area or element is referred to as being "connected" to another layer, area or element, it can be directly connected to the other layer, area or element or can be indirectly connected to the other layer, area or element by intervening layers, areas or elements. For example, in the present specification, when a layer, area or element is referred to as being "electrically connected to" another layer, area or element, it can be directly electrically connected to the other layer, area or element or can be indirectly electrically connected to the other layer, area or element by intervening layers, areas or elements.

In the following embodiments, the x axis, the y axis, and the z axis are not limited to three axes on a Cartesian coordinate system but may be interpreted in a broad sense including them. For example, the x axis, the y axis, and the z axis may be orthogonal to each other but may also refer to different directions not orthogonal to each other.

In the present specification, "A and/or B" refers to A, B, or A and B.

FIG. 1 is a schematic plan view of a display device 10 according to some embodiments.

Referring to FIG. 1, the display device 10 may include a display area DA and a non-display area NDA adjacent to (e.g., in a periphery or outside a footprint of) the display area DA. The display device 10 includes a plurality of pixel areas P located in the display area DA. Although a single pixel area P is illustrated in FIG. 1 for convenience of illustration, a person having ordinary skill in the art would appreciate that the display device 10 may include any suitable number of pixel areas P according to the design of the display device 10.

A display element capable of emitting light (e.g., of a set or predetermined color) may be located in each pixel area P and may be connected to a scan line SL and a data line DL. FIG. 1 may be understood as illustrating a substrate 100 of the display device 10. For example, it may be understood that the substrate 100 has the display area DA and the non-display area NDA.

In the non-display area NDA, a scan driver 1100 providing a scan signal to each pixel area P through a scan line SL, a data driver 1200 providing a data signal to a display element included in each pixel area P, and a main power line for providing first and second power supply voltages may be formed in the non-display area NDA.

Although the data driver 1200 is located on the substrate 100 in FIG. 1, it may also be located on a flexible printed circuit board (FPCB) electrically connected to a pad located on a side of the display device 10 according to some embodiments.

The display device 10 according to some embodiments of the present disclosure may be an organic light emitting display, an inorganic light emitting display, a quantum dot display, or the like. An organic light emitting display will hereinafter be described as an example of the display device 10 according to some embodiments of the present disclosure. However, the display device 10 of embodiments according to the present disclosure is not limited thereto, and features to be described below are applicable to various types of display devices such as those described above.

Figure 2:
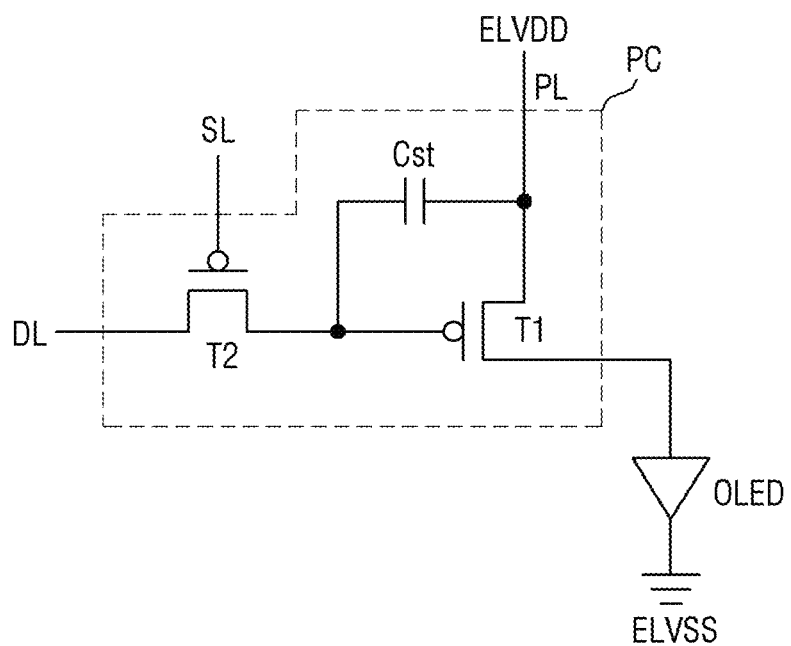
FIG. 2 illustrates a display element located in any one pixel area of the display device according to some embodiments and a pixel circuit connected to the display element.

FIG. 2 illustrates a display element located in any one pixel area of the display device 10 according to some embodiments and a pixel circuit connected to the display element.

Referring to FIG. 2, an organic light emitting diode OLED, which is a display element, is connected to a pixel circuit PC. The pixel circuit PC may include a first thin-film transistor T1, a second thin-film transistor T2, and a storage capacitor Cst. The organic light emitting diode OLED may emit, for example, red, green or blue light or may emit red, green, blue or white light.

The second thin-film transistor T2, which is a switching thin-film transistor, may be connected to a scan line SL and a data line DL and may send a data voltage received from the data line DL to the first thin-film transistor T1 according to a switching voltage received from the scan line SL. The storage capacitor Cst may be connected to the second thin-film transistor T2 and a driving voltage line PL and may store a voltage corresponding to a difference between a voltage received from the second thin-film transistor T2 and a first power supply voltage ELVDD supplied to the driving voltage line PL.

The first thin-film transistor T1, which is a driving thin-film transistor, may be connected to the driving voltage line PL and the storage capacitor Cst and may control a driving current flowing from the driving voltage line PL to the organic light emitting diode OLED according to a voltage value stored in the storage capacitor Cst. The organic light emitting diode OLED may emit light having a luminance (e.g., a set or predetermined luminance) in response to the driving current. A counter electrode (e.g., a cathode) of the organic light emitting diode OLED may receive a second power supply voltage ELVSS.

Although the pixel circuit PC includes two thin-film transistors and one storage capacitor in FIG. 2, the number of thin-film transistors or the number of storage capacitors can be variously changed according to the design of the pixel circuit PC in other embodiments. That is, the pixel circuit PC may include additional transistors, capacitors, and other electrical components without departing from the spirit and scope of embodiments according to the present disclosure.

Figure 3:
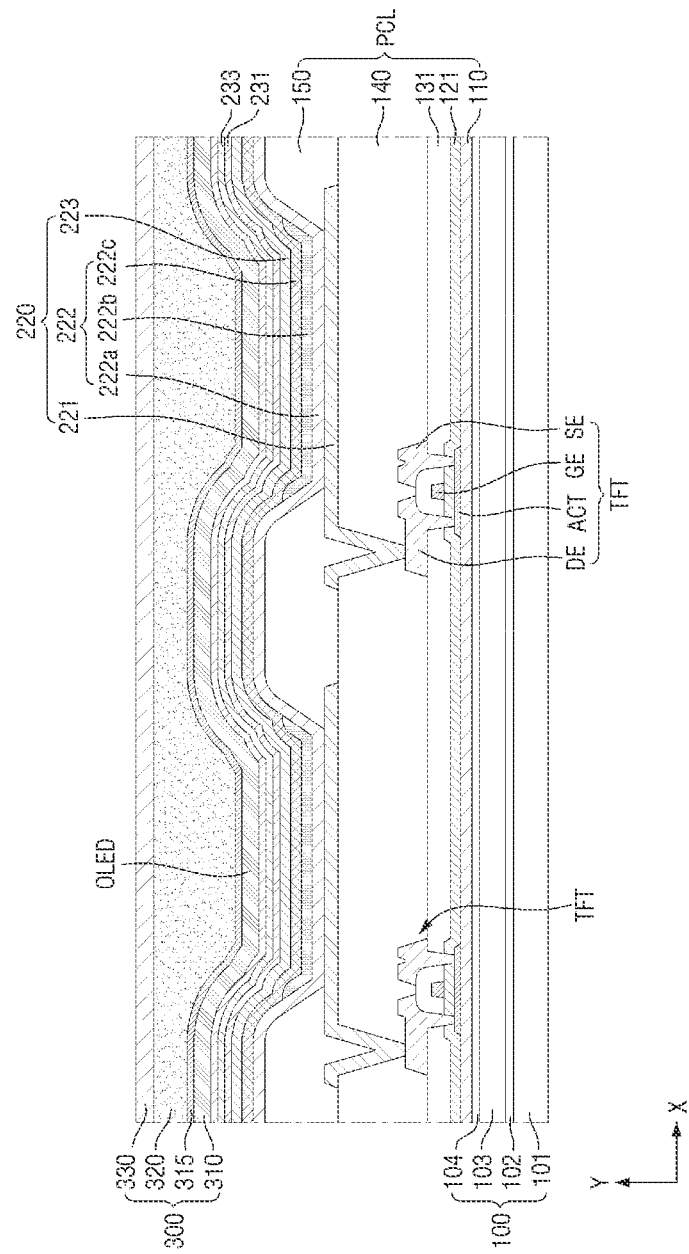
FIG. 3 is a cross-sectional view of a part of the display device according to some embodiments.

FIG. 3 is a cross-sectional view of a part of the display device 10 according to some embodiments.

Referring to FIG. 3, a pixel circuit layer PCL including pixel circuits is located on the substrate 100, and organic light emitting diodes OLED, which are display elements, are located on the pixel circuit layer PCL and covered by a thin-film encapsulation layer 300.

The substrate 100 may include polymer resin. The substrate 100 including the polymer resin may have flexible, rollable, or bendable properties.

According to some embodiments, the substrate 100 may include a first base layer 101, a first barrier layer 102, a second base layer 103, and a second barrier layer 104 as illustrated in FIG. 3. Each of the first base layer 101 and the second base layer 103 may include a polymer resin. For example, each of the first base layer 101 and the second base layer 103 may include a polymer resin such as polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), or cellulose acetate propionate (CAP). Each of the first barrier layer 102 and the second barrier layer 104 is a barrier layer for preventing or reducing penetration of foreign substances or contaminants and may be a single layer or a multilayer including an inorganic material such as silicon nitride or silicon oxide.

Figure 4:
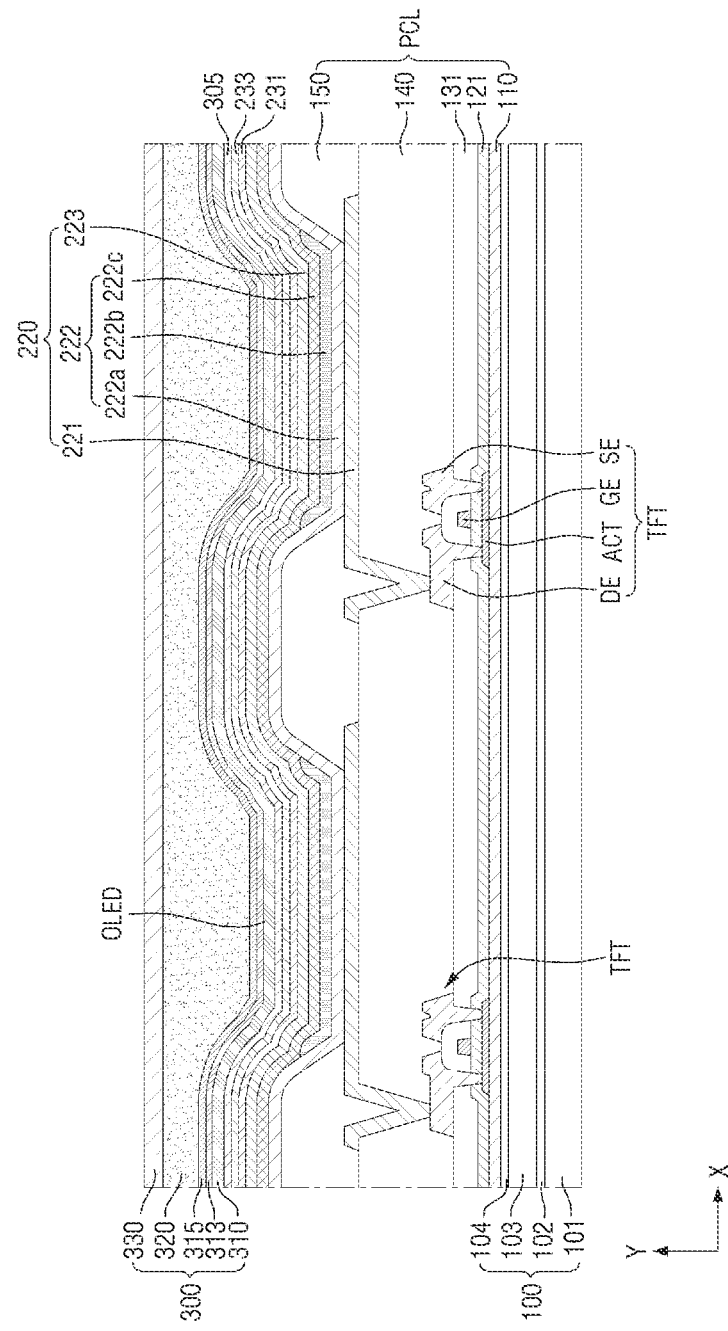
FIG. 4 is a cross-sectional view of a part of a display device according to a modification of the display device of FIG. 3.

FIG. 4 is a cross-sectional view of a part of a display device according to a modification of the display device 10 of FIG. 3.

According to some embodiments, a substrate 100 may be a single layer including a glass material as illustrated in FIG. 4. For example, the substrate 100 may be a glass substrate including SiO2 as its main component.

Referring again to FIG. 3, the pixel circuit layer PCL on the substrate 100 described above may include thin-film transistors TFT and, according to some embodiments, may include a storage capacitor connected to each of the thin-film transistors TFT. The structure of the thin-film transistor TFT may be the same in each pixel. Each thin-film transistor TFT may be connected to a display element provided in each pixel.

Each of the thin-film transistors TFT may include a semiconductor layer Act including amorphous silicon, polycrystalline silicon or an organic semiconductor material, a gate electrode GE, a source electrode SE, and a drain electrode DE. To secure insulation between the semiconductor layer Act and the gate electrode GE, a gate insulating layer 121 including an inorganic material such as silicon oxide, silicon nitride, and/or silicon oxynitride may be interposed between the semiconductor layer Act and the gate electrode GE. An interlayer insulating layer 131 including an inorganic material such as silicon oxide, silicon nitride, and/or silicon oxynitride may be located on the gate electrode GE, and the source electrode SE and the drain electrode DE may be located on the interlayer insulating layer 131. An insulating layer including an inorganic material may be formed through chemical vapor deposition (CVD) or atomic layer deposition (ALD).

The gate electrode GE, the source electrode SE, and the drain electrode DE may be made of various conductive materials. The gate electrode GE may include molybdenum or aluminum and may have a single-layer or multilayer structure. For example, the gate electrode GE may be a single layer of molybdenum or may have a three-layer structure including a molybdenum layer, an aluminum layer and a molybdenum layer. Each of the source electrode SE and the drain electrode DE may include titanium or aluminum and may have a single-layer or multilayer structure. According to some embodiments, each of the source electrode SE and the drain electrode DE may have a three-layer structure including a titanium layer, an aluminum layer, and a titanium layer.

A bottom buffer layer 110 including an inorganic material such as silicon oxide, silicon nitride and/or silicon oxynitride may be interposed between the thin-film transistors TFT structured as described above and the substrate 100. The bottom buffer layer 110 may increase the smoothness of an upper surface of the substrate 100 or prevent, reduce, or minimize penetration of impurities from the substrate 100 into the semiconductor layers Act of the thin-film transistors TFT.

A planarization insulating layer 140 may be located on the thin-film transistors TFT. The planarization insulating layer 140 may be made of an organic material such as acrylic, benzocyclobutene (BCB), or hexamethyldisiloxane (HMDSO). Although the planarization insulating layer 140 is illustrated as a single layer in FIG. 3, it may also be a multilayer.

Each of the organic light emitting diodes OLED includes a pixel electrode 221, an intermediate layer 222, and a counter electrode 223.

The pixel electrode 221 is located on the planarization insulating layer 140, and one pixel electrode 221 may be located in each pixel. The pixel electrode 221 may be a reflective electrode. According to some embodiments, the pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound of the same. According to some embodiments, the pixel electrode 221 may include a transparent or semi-transparent electrode layer located on and/or under the above reflective layer. The transparent or semi-transparent electrode layer may include at least one of indium tin oxide (ITO), indium zinc oxide (IZO), zinc oxide (ZnO), indium oxide (In2O3), indium gallium oxide (IGO), or aluminum zinc oxide (AZO). According to some embodiments, the pixel electrode 210 may have a three-layer structure of an ITO layer, an Ag layer, and an ITO layer.

A pixel defining layer 150 is located on the pixel electrodes 210. The pixel defining layer 150 has an opening 150OP exposing a central part of each pixel electrode 210. The pixel defining layer 150 may increase a distance between an edge of each pixel electrode 210 and the counter electrode 223 to prevent or reduce instances of an arc occurring at the edge of the pixel electrode 210. The pixel defining layer 150 may be formed of an organic insulating material, such as polyimide, polyimide, acrylic resin, benzocyclobutene, hexamethyldisiloxane (HMDSO), or phenolic resin, by using a suitable deposition or forming method such as spin coating.

A light emitting layer 222b may be formed on each pixel electrode 210 exposed through the opening 150OP of the pixel defining layer 150. The light emitting layer 222b may be an organic material including a fluorescent or phosphorescent material capable of emitting red, green or blue light. The above organic material may be a low molecular weight organic material or a high molecular weight organic material.

A first functional layer 222a and a second functional layer 222c may be located under and on the light emitting layer 222b, respectively. The first functional layer 222a may include, for example, a hole transport layer (HTL) or include an HTL and a hole injection layer (HIL). The second functional layer 222c is an element located on the light emitting layer 222b and may include an electron transport layer (ETL) and/or an electron injection layer (EIL). The second functional layer 222c is optional. In some embodiments, the second functional layer 222c may not be provided.

The light emitting layers 222b may be arranged to correspond to the openings 150OP of the pixel defining layer 150, respectively.

Like the counter electrode 223 to be described later, each of the first functional layer 222a and the second functional layer 222c may be a common layer integrally formed to cover the entire substrate 100, for example, cover the entire display area DA of the substrate 100.

The counter electrode 223 may include a (semi-) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy of the same. Alternatively, the counter electrode 223 may further include a layer such as ITO, IZO, ZnO or In2O3 on the (semi-) transparent layer including any one of the above materials. According to some embodiments, the counter electrode 223 may include silver (Ag), magnesium (Mg), or an alloy of silver (Ag) and magnesium (Mg).

A capping layer 231 may be positioned or formed on the counter electrode 223. For example, the capping layer 231 may include lithium fluoride (LiF), an inorganic insulating material, or an organic insulating material. The capping layer 231 may cover and protect the counter electrode 223 from above. Although the capping layer 231 is illustrated as being formed of one layer in FIG. 3, embodiments according to the present disclosure are not limited thereto, and the capping layer 231 may also be formed of a plurality of stacked layers. Each of the stacked layers may be selected from the lithium fluoride (LiF), the inorganic insulating material, and the organic insulating material.

For example, the capping layer 231 may include an inorganic insulating material. For example, the capping layer 231 may include one or more insulating materials selected from aluminum oxide, titanium oxide, tantalum oxide, hafnium oxide, zinc oxide, silicon oxide, silicon nitride, and silicon oxynitride. Materials of the stacked layers of the capping layer 231 may be different from each other or may be the same.

As described above, the display elements included in the display device 10 emit light (e.g., of a set or predetermined color) to display images. Here, the emitted light may pass through the thin-film encapsulation layer 300 for sealing the display elements. When the thin-film encapsulation layer 300 has a structure in which a plurality of layers are stacked according to some embodiments, light emitted from the display elements may be interfered with by layer thicknesses of the thin-film encapsulation layer 300. Such interference may increase the amount of movement in the overall color temperature direction on a minimum perceptible color difference (MPCD).

However, according to some embodiments, it may be possible to prevent or reduce the amount of movement in the overall color temperature direction on the MPCD from being increased by the interference by adjusting refractive indices and thicknesses of a first auxiliary layer, a (1-1)th inorganic encapsulation layer, and a (1-2)th inorganic encapsulation layer stacked sequentially from the capping layer 231. This will be described in detail later.

A first auxiliary layer 233 may be located on the capping layer 231. The first auxiliary layer 233 may include lithium fluoride (LiF), an inorganic insulating material, or an organic insulating material. The inorganic insulating material may include aluminum oxide, titanium oxide, tantalum oxide, hafnium oxide, zinc oxide, silicon oxide, silicon nitride, or silicon oxynitride.

According to some embodiments, the first auxiliary layer 233 may include lithium fluoride (LiF).

The thin-film encapsulation layer 300 may be located on the first auxiliary layer 233. The thin-film encapsulation layer 300 may include at least one inorganic encapsulation layer and at least one organic encapsulation layer. For example, as illustrated in FIG. 4, the thin-film encapsulation layer 300 may include a first inorganic encapsulation layer on the first auxiliary layer 233, a buffer layer 313 on the first inorganic encapsulation layer, a second auxiliary layer on the buffer layer 313, an organic encapsulation layer 320 on the second auxiliary layer, and a second inorganic encapsulation layer 330 on the organic encapsulation layer 320.

The first inorganic encapsulation layer may be formed of a plurality of stacked layers. The stacked layers may include a (1-1)th inorganic encapsulation layer 305 on the first auxiliary layer 233 and a (1-2)th inorganic encapsulation layer 310 on the (1-1)th inorganic encapsulation layer 305.

Although a case where the first inorganic encapsulation layer includes only the (1-1)th inorganic encapsulation layer 305 and the (1-2)th inorganic encapsulation layer 310 is described in the present specification, embodiments according to the present disclosure are not limited thereto, and the buffer layer 313 may also be an element included in the first inorganic encapsulation layer. For ease of description, the buffer layer 313 will be described separately from the first inorganic encapsulation layer.

Each of the first inorganic encapsulation layer and the second inorganic encapsulation layer 330 may include one or more inorganic insulating materials selected from aluminum oxide, titanium oxide, tantalum oxide, hafnium oxide, zinc oxide, silicon oxide, silicon nitride, and silicon oxynitride. In some embodiments, the first inorganic encapsulation layer and the second inorganic encapsulation layer 330 may include an inorganic insulating layer including a nonmetal element, for example, may include silicon oxide, silicon nitride, or silicon oxynitride.

The material of the (1-1)th inorganic encapsulation layer 305 and the material of the (1-2)th inorganic encapsulation layer 310 may be different from each other. For example, the (1-1)th inorganic encapsulation layer 305 may include silicon nitride, and the (1-2)th inorganic encapsulation layer 310 may include silicon oxynitride.

The buffer layer 313 may be located on the (1-2)th inorganic encapsulation layer 310. The buffer layer 313 may include one or more inorganic insulating materials selected from aluminum oxide, titanium oxide, tantalum oxide, hafnium oxide, zinc oxide, silicon oxide, silicon nitride, and silicon oxynitride. According to some embodiments, each of the buffer layer 313 and the (1-2)th inorganic encapsulation layer 310 may include silicon oxynitride. However, a refractive index of the (1-2)th inorganic encapsulation layer 310 and a refractive index of the buffer layer 313 may be different from each other.

A second auxiliary layer 315 may be an inorganic insulating layer including a non-metal element. The second auxiliary layer 315 may include one or more inorganic insulating materials selected from aluminum oxide, titanium oxide, tantalum oxide, hafnium oxide, zinc oxide, silicon oxide, silicon nitride, and silicon oxynitride. According to some embodiments, the second auxiliary layer 315 may include silicon oxynitride or silicon oxide. In the silicon oxynitride of the second auxiliary layer 315, a ratio of oxygen to nitrogen may be greater than 1.

The organic encapsulation layer 320 may be located between the second auxiliary layer 315 and the second inorganic encapsulation layer 330. The organic encapsulation layer 320 may reduce internal stress of the first inorganic encapsulation layer and/or the second inorganic encapsulation layer 330. The organic encapsulation layer 320 may include a polymer-based material. The polymer-based material may include polyethylene terephthalate, polyethylene naphthalate, polycarbonate, polyimide, polyethylene sulfonate, polyoxymethylene, polyarylate, hexamethyldisiloxane, acrylic resin (e.g., polymethyl methacrylate or polyacrylic acid), or any combination of the same.

The organic encapsulation layer 320 may be formed by applying a monomer having flowability and then curing the monomer layer using heat or light such as ultraviolet light. Alternatively, the organic encapsulation layer 320 may be formed by applying the polymer-based material described above.

Light emitted from the organic light emitting diode OLED located in each pixel passes through the thin-film encapsulation layer 300 to the outside. Here, as described above, the amount of movement in the overall color temperature direction on the MPCD may be increased by the thin-film interference phenomenon of the thin-film encapsulation layer 300 when seen in a direction (e.g., a z direction) perpendicular to the substrate 100 and a direction oblique to the substrate 100. However, according to some embodiments, it may be possible to prevent or reduce the amount of movement in the overall color temperature direction on the MPCD from being increased by the interference by adjusting magnitudes of refractive indices of the capping layer 231, the first auxiliary layer 233, and at least one layer of the first inorganic encapsulation layer.

Figure 5:
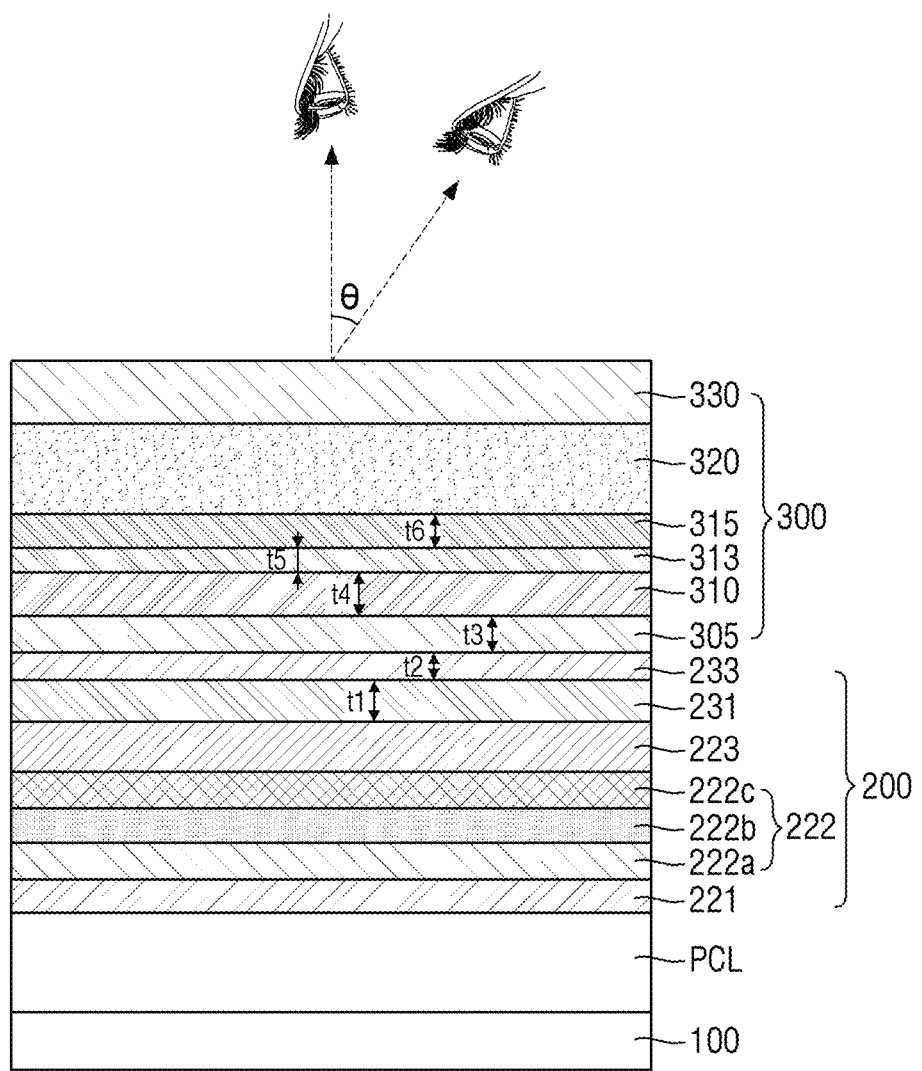
FIG. 5 is a schematic mimetic diagram of the display device according to some embodiments.

FIG. 5 is a schematic mimetic diagram of the display device 10 according to some embodiments.

Referring to FIG. 5, the display device 10 includes the substrate 100, the pixel circuit layer PCL, a display layer 200 including the pixel electrode 221, the intermediate layer 222, the counter electrode 223, the capping layer 231 and the first auxiliary layer 233, and the thin-film encapsulation layer 300 stacked sequentially.

The thin-film encapsulation layer 300 may include the first inorganic encapsulation layer including a plurality of layers, the buffer layer 313, the second auxiliary layer 315, the organic encapsulation layer 320, and the second inorganic encapsulation layer 330 arranged sequentially along a light traveling direction (or a direction from the display layer 200 toward the thin-film encapsulation layer 300).

The refractive indices of the capping layer 231, the first auxiliary layer 233, and the layers of the first inorganic encapsulation layer may be alternately high and low.

The refractive index of the capping layer 231 may be 1.6 to 2.3. For example, the refractive index of the capping layer 231 may be about 1.97.

The refractive index of the first auxiliary layer 233 may be smaller than each of the refractive index of the capping layer 231 and the refractive index of the (1-1)th inorganic encapsulation layer 305.

A thickness t1 of the capping layer 231 may be 50 to 150 nm.

The refractive index of the (1-1)th inorganic encapsulation layer 305 may be 1.7 to 2.0. For example, the refractive index of the (1-1)th inorganic encapsulation layer 305 may be 1.8 to 1.9. For example, the refractive index of the (1-1)th inorganic encapsulation layer 305 may be 1.85 or 1.89.

Because the refractive index of the first auxiliary layer 233 is smaller than each of the refractive index of the capping layer 231 and the refractive index of the (1-1)th inorganic encapsulation layer 305 as described above, it may be 1.2 to less than 1.6. For example, the refractive index of the first auxiliary layer 233 may be 1.39.

A thickness t2 of the first auxiliary layer 233 may be 20 to 100 nm.

A thickness t3 of the (1-1)th inorganic encapsulation layer 305 may be 100 to 300 nm.

The refractive index of the (1-2)th inorganic encapsulation layer 310 may be smaller than the refractive index of the (1-1)th inorganic encapsulation layer 305.

The refractive index of the (1-2)th inorganic encapsulation layer 310 may be 1.5 to less than 1.7. For example, the refractive index of the (1-2)th inorganic encapsulation layer 310 may be 1.57.

A thickness t4 of the (1-2)th inorganic encapsulation layer 310 may be 400 nm or more.

According to some embodiments, a low refractive index inorganic encapsulation layer having a refractive index of about 1.2 to less than 1.6 may be located between the (1-1)th inorganic encapsulation layer 305 and the (1-2)th inorganic encapsulation layer 310. The low refractive index inorganic encapsulation layer may include at least one of the example materials of the (1-2)th inorganic encapsulation layer 310.

According to some embodiments, because the refractive index is high, low, and high again in the order of the capping layer 213, the first auxiliary layer 233, and the (1-1)th inorganic encapsulation layer 305 stacked sequentially, the movement trajectory in the overall color temperature direction on the MPCD can be controlled, and the display quality may be improved.

For example, it may be possible to prevent or reduce an increase in the amount of movement in the overall color temperature direction on the MPCD.

Figure 6:
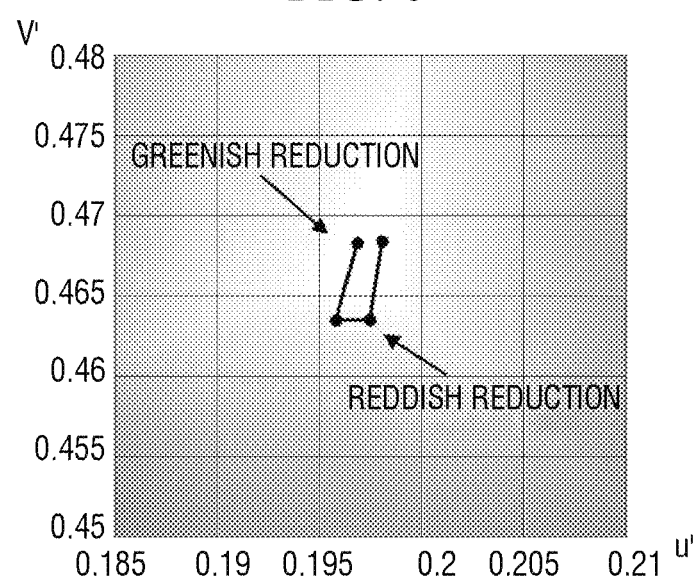
FIG. 6 illustrates a minimum perceptible color difference (MPCD) by the display device according to some embodiments.

FIG. 6 illustrates an MPCD by the display device 10 according to some embodiments.

FIG. 6 illustrates CIE1976 color coordinates (u', v') as an example of the MPCD. The horizontal axis of the CIE1976 color coordinates may represent the u' coordinate, and the vertical axis may represent the v' coordinate.

As illustrated in FIG. 6, because the refractive index is high, low, and high again in the order of the capping layer 231, the first auxiliary layer 233, and the (1-1)th inorganic encapsulation layer 305 stacked sequentially, a coordinate value of u' at 30° may be smaller than a coordinate value of u' at 0° on the CIE1976 color coordinates (u', v'), and a coordinate value of u' at 60° may be larger than a coordinate value of u' at 45° on the CIE1976 color coordinates (u', v').

That is, because the coordinate value of u' at a low angle (e.g., 30°) is smaller than the coordinate value of u' at 0°, a reddish phenomenon can be reduced at a low angle (e.g., 30°). Also, because the coordinate value of u' at a high angle (e.g., 60°) is larger than the coordinate value of u' at 45°, a greenish phenomenon can be reduced at a high angle (e.g., 60°).

In addition, because the thickness t4 of the (1-2)th inorganic encapsulation layer 310 is designed to be 400 nm or more, the dispersion of movement trajectories in the controlled color temperature direction of the MPCD can be greatly reduced.

Again, referring to FIG. 5, the buffer layer 313 may be arranged on the (1-2)th inorganic encapsulation layer 310.

The material of the buffer layer 313 may include at least one of the example materials of the (1-2)th inorganic encapsulation layer 310.

The refractive index of the buffer layer 313 may be smaller than the refractive index of the (1-2)th inorganic encapsulation layer 310. For example, the refractive index of the buffer layer 313 may be, but is not limited to, about 1.57.

A thickness of the buffer layer 313 may be 30 to 100 nm.

According to some embodiments, because the thickness of the buffer layer 313 is 30 to 100 nm, the dispersion of movement trajectories (in particular, 30°, 60°) in the controlled color temperature direction of the MPCD can be greatly reduced.

The second auxiliary layer 315 may be further arranged on the buffer layer 313. The refractive index of the buffer layer 313 may be between a refractive index of the second auxiliary layer 315 and the refractive index of the (1-2)th inorganic encapsulation layer 310.

A refractive index n3 of the buffer layer 313 may satisfy the following condition.

$$\min(n1, n2) + |n2-n1| \times 0.25 < n3 < \min(n1, n2) + |n2-n1| \times 0.75,$$

where n1 is the refractive index of the (1-2)th inorganic encapsulation layer 310, n2 is the refractive index of the second auxiliary layer 315, min(n1, n2) is a minimum value among n1 and n2, and |n2-n1| is an absolute value of a difference between n2 and n1.

Further characteristics of some embodiments of the display device will now be described in more detail below. In the following description, the same elements as those of the embodiments described above will be indicated by the same reference numerals, and some repetitive description may be omitted or given briefly.

Figure 7:
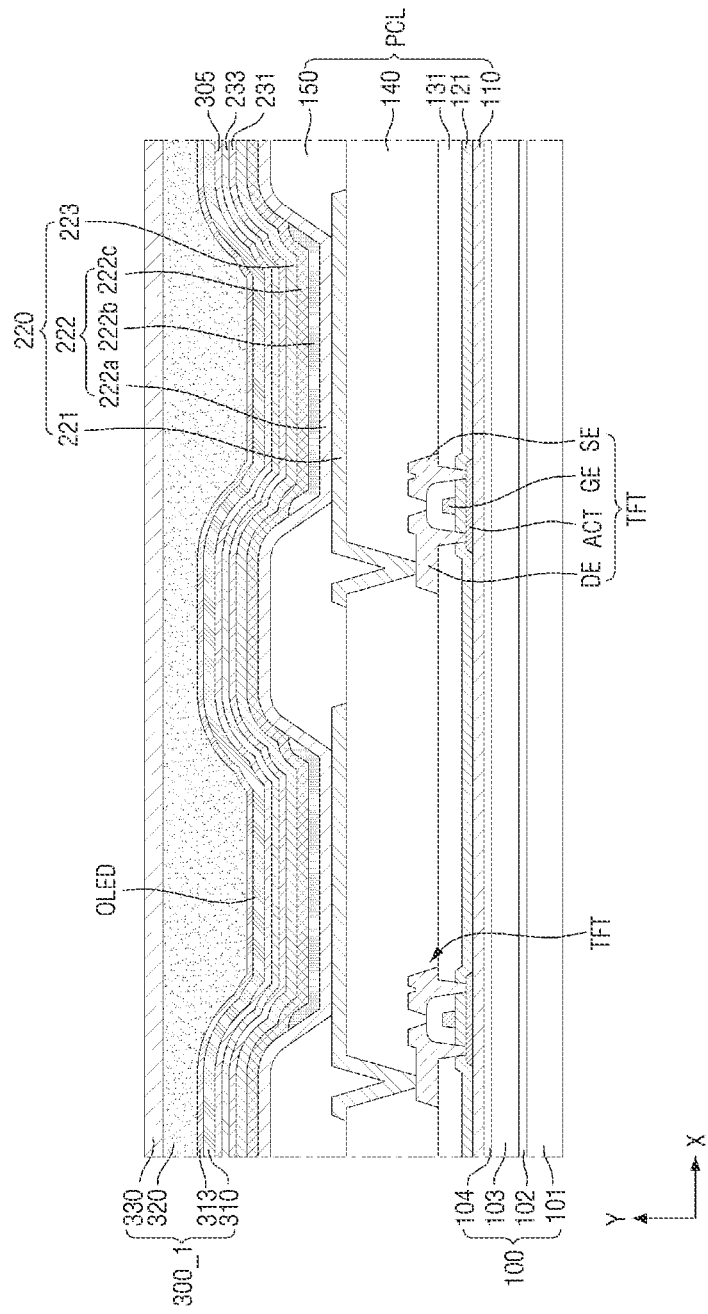
FIG. 7 is a cross-sectional view of a part of a display device according to some embodiments.
Figure 8:
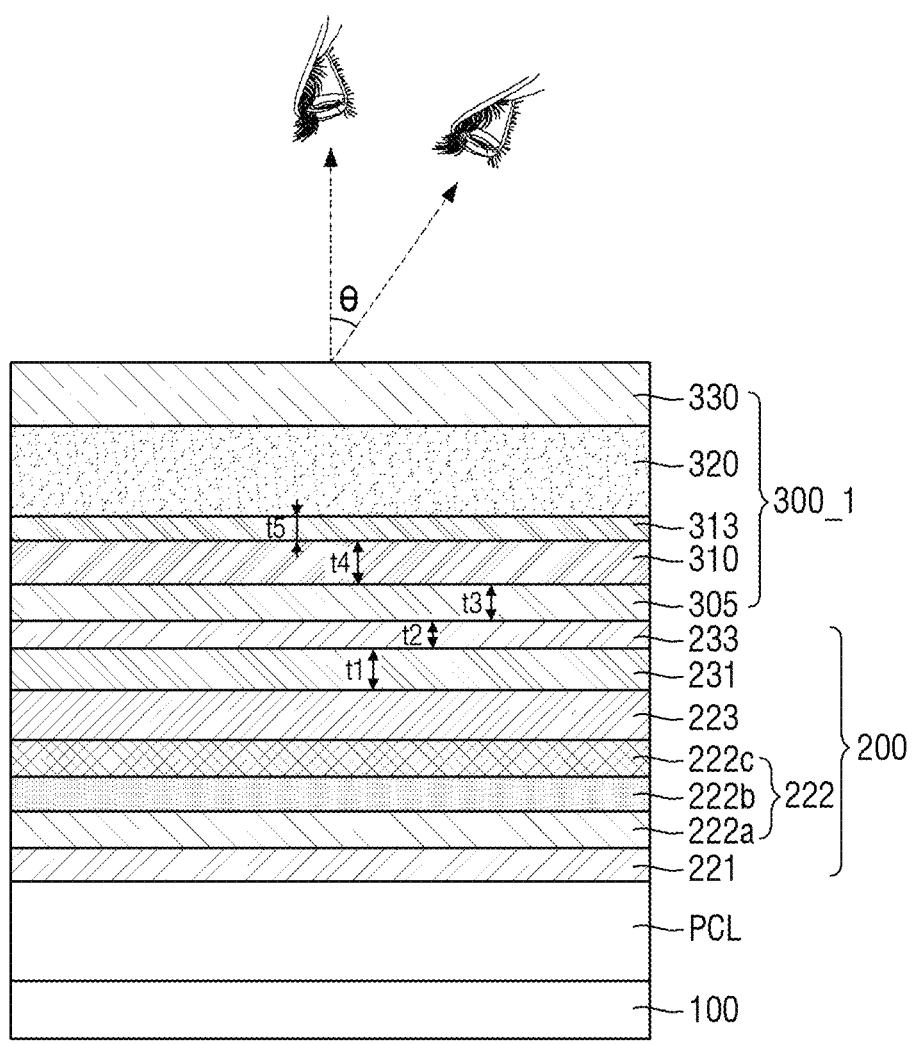
FIG. 8 is a schematic mimetic diagram of the display device of FIG. 7.

FIG. 7 is a cross-sectional view of a part of a display device according to some embodiments. FIG. 8 is a schematic mimetic diagram of the display device of FIG. 7.

Referring to FIGS. 7 and 8, the display device according to some embodiments is different from the display device of FIG. 5 in that the second auxiliary layer 315 of FIG. 5 may be omitted.

For example, a buffer layer 313 of a thin-film encapsulation layer 300_1 of the display device according to some embodiments may be between a (1-2)th inorganic encapsulation layer 310 and an organic encapsulation layer 320.

Other details are the same as those of the display device of FIGS. 4 and 5, and thus some redundant description thereof may be omitted.

Figure 9:
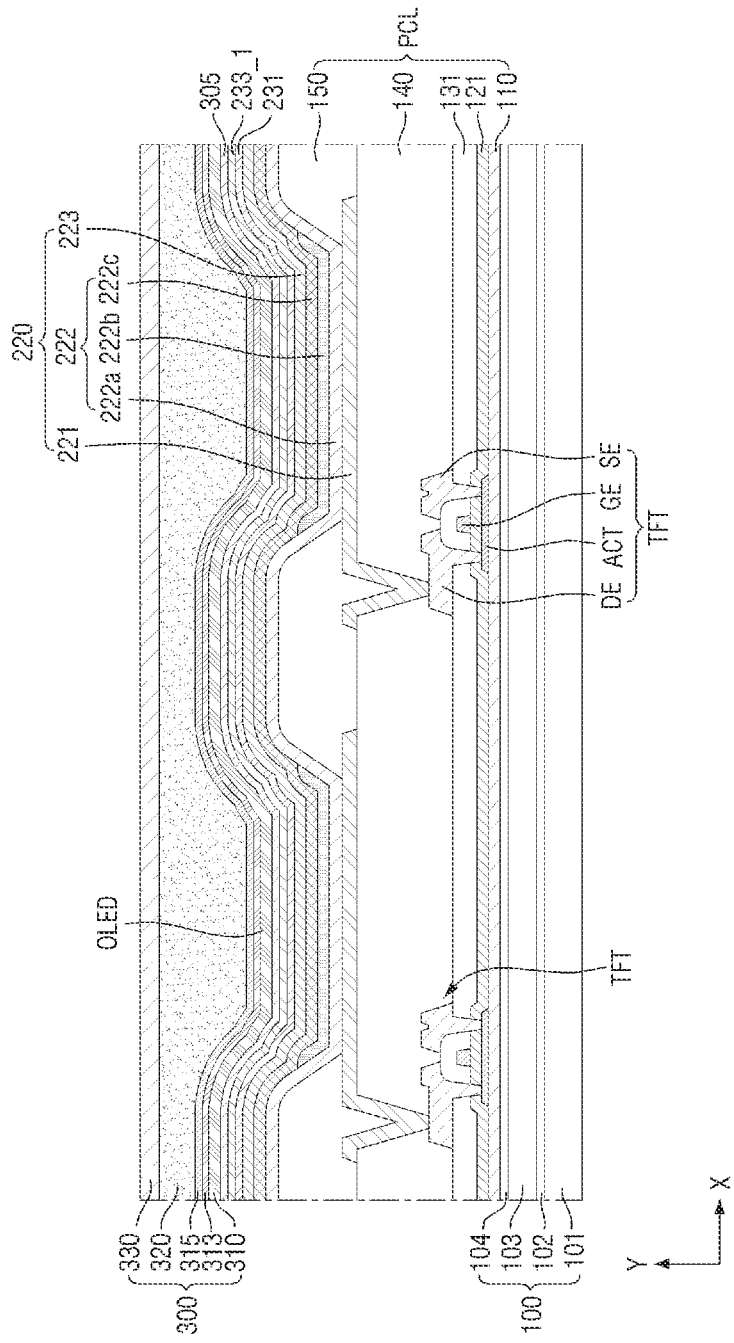
FIG. 9 is a cross-sectional view of a part of a display device according to some embodiments.
Figure 10:
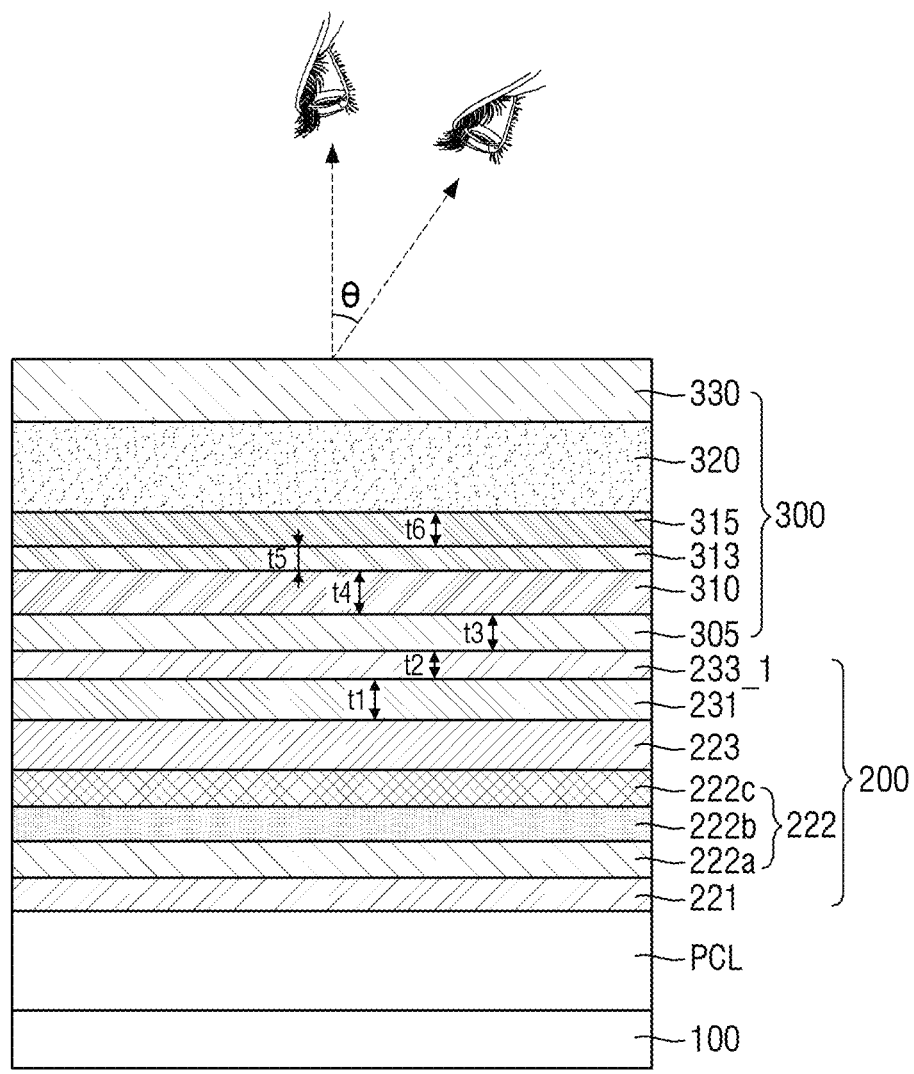
FIG. 10 is a schematic mimetic diagram of the display device of FIG. 9.

FIG. 9 is a cross-sectional view of a part of a display device according to some embodiments. FIG. 10 is a schematic mimetic diagram of the display device of FIG. 9.

Referring to FIGS. 9 and 10, the display device according to some embodiments is different from the display device of FIGS. 4 and 5 in that a first auxiliary layer 233_1 includes an inorganic insulating material.

For example, the first auxiliary layer 233_1 of the display device according to some embodiments may include an inorganic insulating material. Examples of the inorganic insulating material may include aluminum oxide, titanium oxide, tantalum oxide, hafnium oxide, zinc oxide, silicon oxide, silicon nitride, and silicon oxynitride. For example, the first auxiliary layer 233_1 may include silicon oxynitride.

Other details are the same as those of the display device of FIGS. 5 and 6, and thus a redundant description thereof will be omitted.

Figure 11:
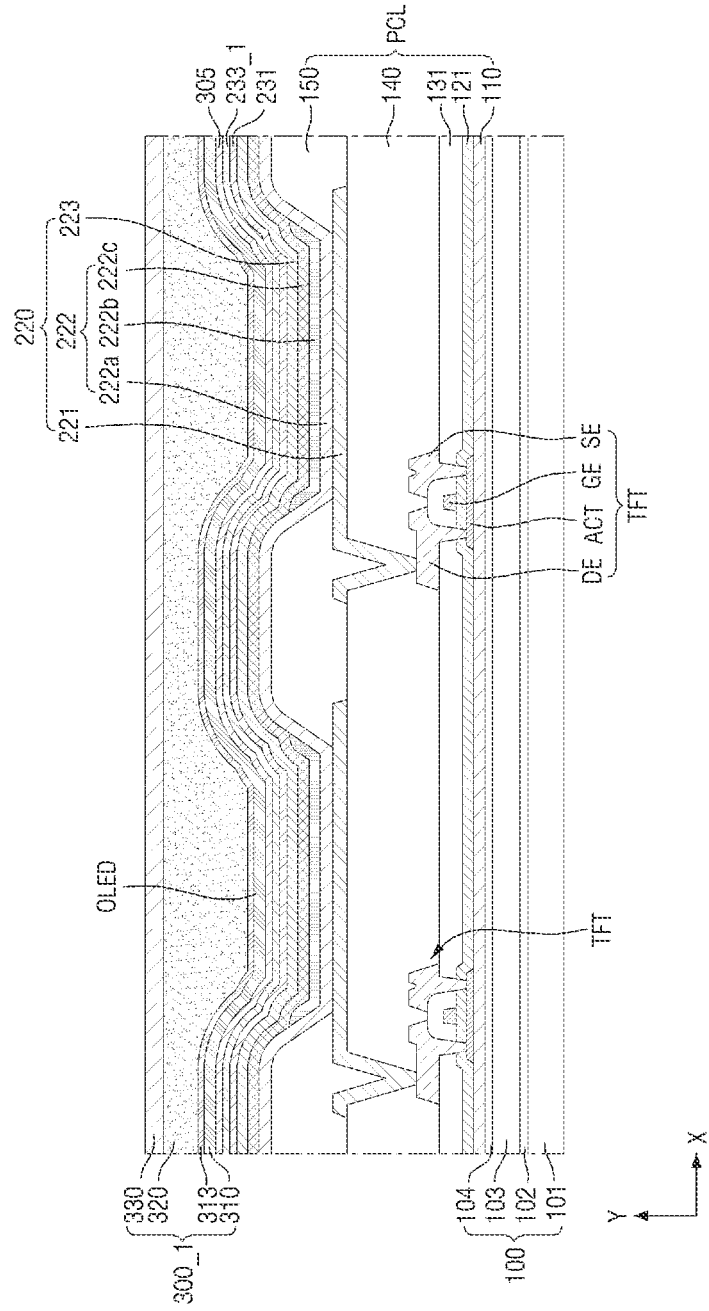
FIG. 11 is a cross-sectional view of a part of a display device according to some embodiments.
Figure 12:
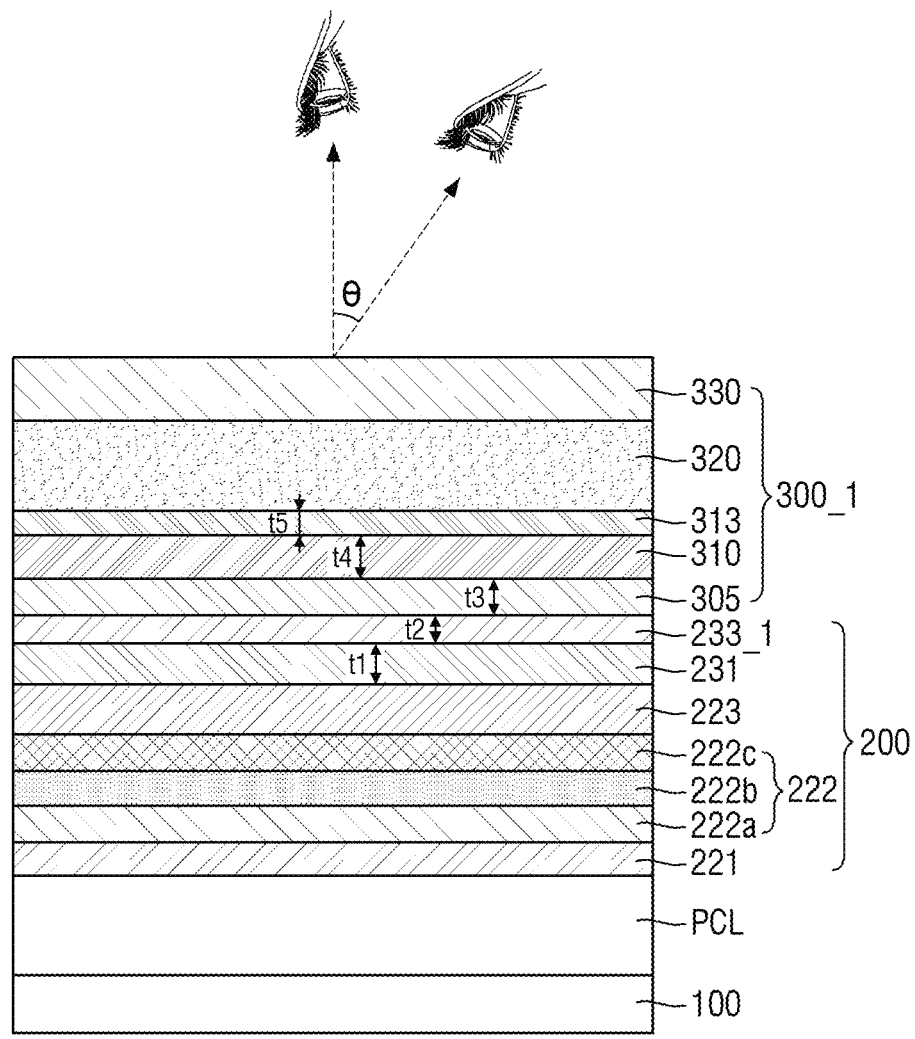
FIG. 12 is a schematic mimetic diagram of the display device of FIG. 10.

FIG. 11 is a cross-sectional view of a part of a display device according to some embodiments. FIG. 12 is a schematic mimetic diagram of the display device of FIG. 10.

Referring to FIGS. 11 and 12, the display device according to some embodiments may be different from embodiments of the display device of FIGS. 7 and 8 in that a first auxiliary layer 233_1 includes an inorganic insulating material.

For example, the first auxiliary layer 233_1 of the display device according to some embodiments may include an inorganic insulating material. Examples of the inorganic insulating material may include aluminum oxide, titanium oxide, tantalum oxide, hafnium oxide, zinc oxide, silicon oxide, silicon nitride, and silicon oxynitride. For example, the first auxiliary layer 233_1 may include silicon oxynitride.

Other details are the same as those of the display device of FIGS. 7 and 8, and thus some redundant description thereof may be omitted.

Figure 13:
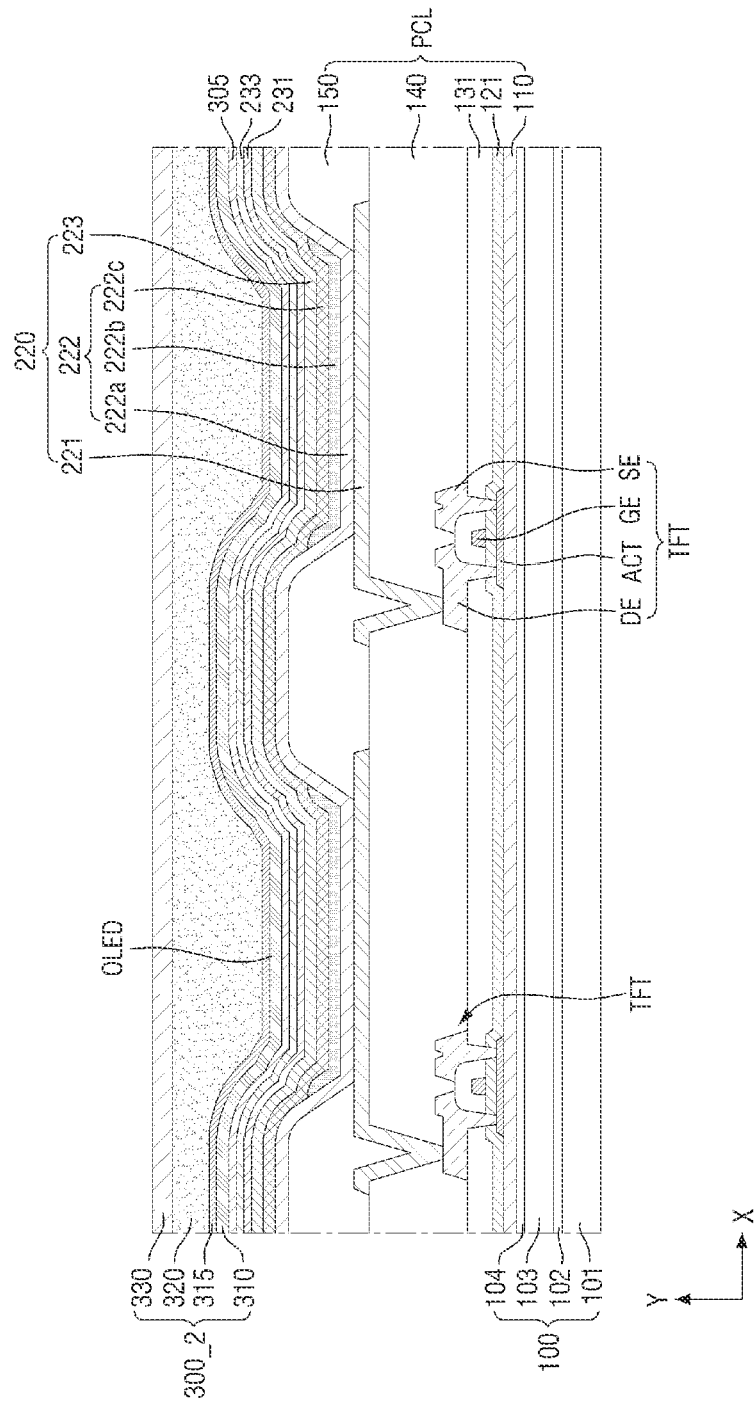
FIG. 13 is a cross-sectional view of a part of a display device according to some embodiments.
Figure 14:
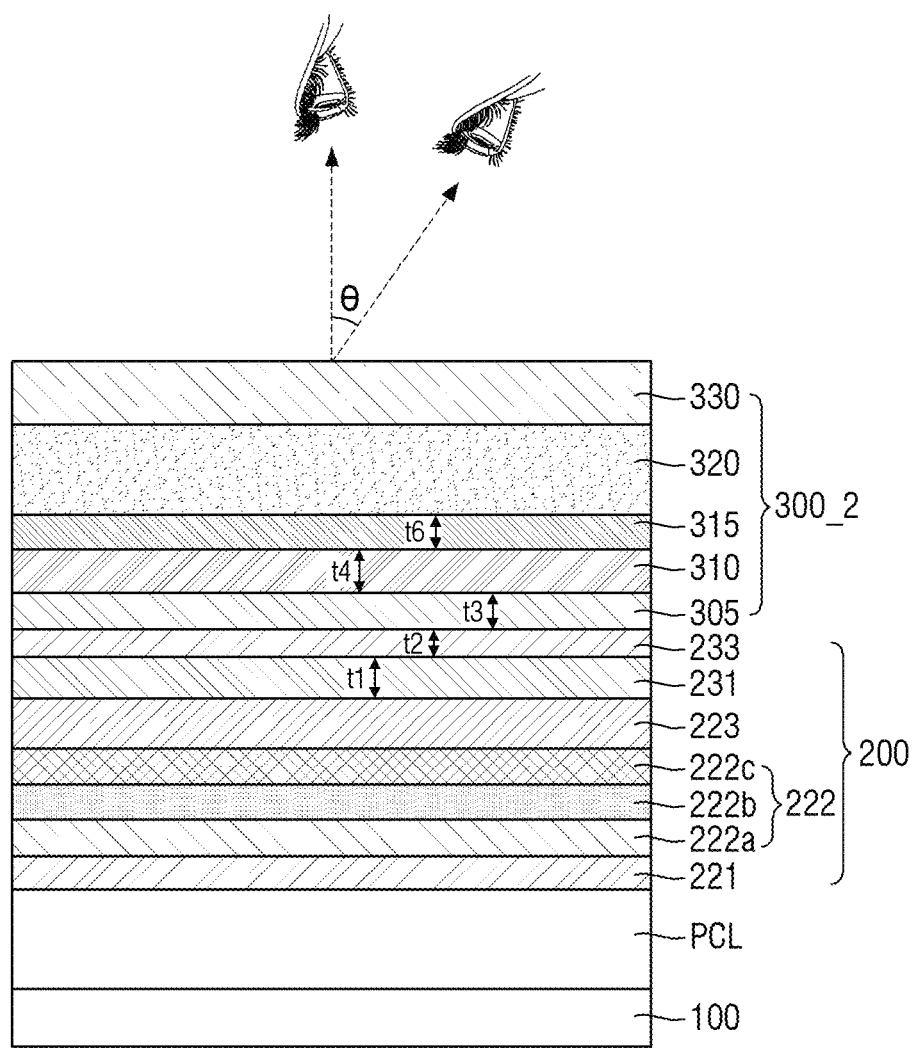
FIG. 14 is a schematic mimetic diagram of the display device of FIG. 13.

FIG. 13 is a cross-sectional view of a part of a display device according to some embodiments. FIG. 14 is a schematic mimetic diagram of the display device of FIG. 13.

Referring to FIGS. 13 and 14, the display device according to some embodiments may different from the embodiments of display device described with respect to FIGS. 4 and 5 in that a thin-film encapsulation layer 300_2 may not include the buffer layer 313 of FIG. 5.

For example, the thin-film encapsulation layer 300_2 of the display device according to some embodiments may not include the buffer layer 313 of FIG. 5. That is, a second auxiliary layer 315 may be interposed between a (1-2)th inorganic encapsulation layer 310 and an organic encapsulation layer 320.

Other details are the same as those described above in FIGS. 4 and 5, and thus some redundant description thereof may be omitted.

Figure 15:
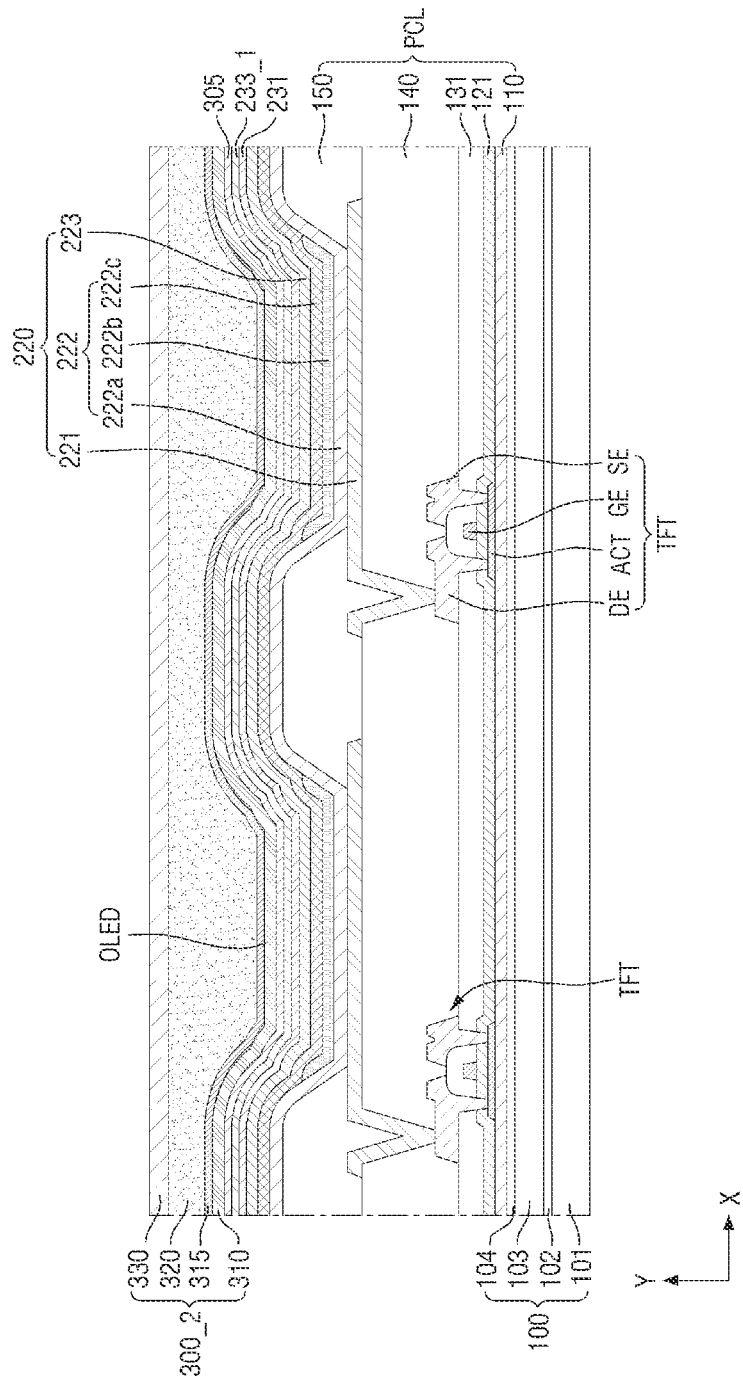
FIG. 15 is a cross-sectional view of a part of a display device according to some embodiments.
Figure 16:
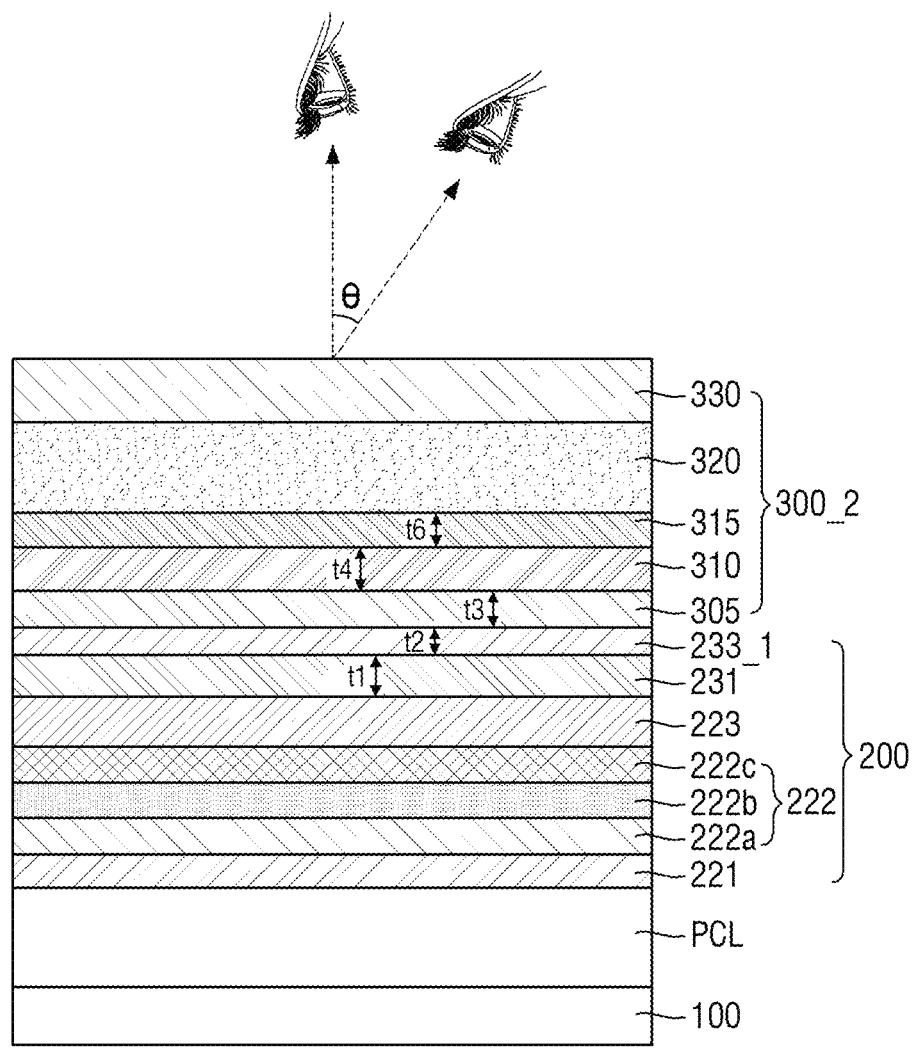
FIG. 16 is a schematic mimetic diagram of the display device of FIG. 15.

FIG. 15 is a cross-sectional view of a part of a display device according to some embodiments. FIG. 16 is a schematic mimetic diagram of the display device of FIG. 15.

Referring to FIGS. 15 and 16, the display device according to some embodiments is different from embodiments of the display device described with respect to FIGS. 9 and 10 in that a thin-film encapsulation layer 300_2 does not include a buffer layer 313 of FIG. 10.

For example, the thin-film encapsulation layer 300_2 of the display device according to some embodiments may not include the buffer layer 313 of FIG. 10. That is, a second auxiliary layer 315 may be interposed between a (1-2)th inorganic encapsulation layer 310 and an organic encapsulation layer 320.

Other details are the same as those described above in FIGS. 9 and 10, and thus some redundant description thereof may be omitted.

Figure 17:
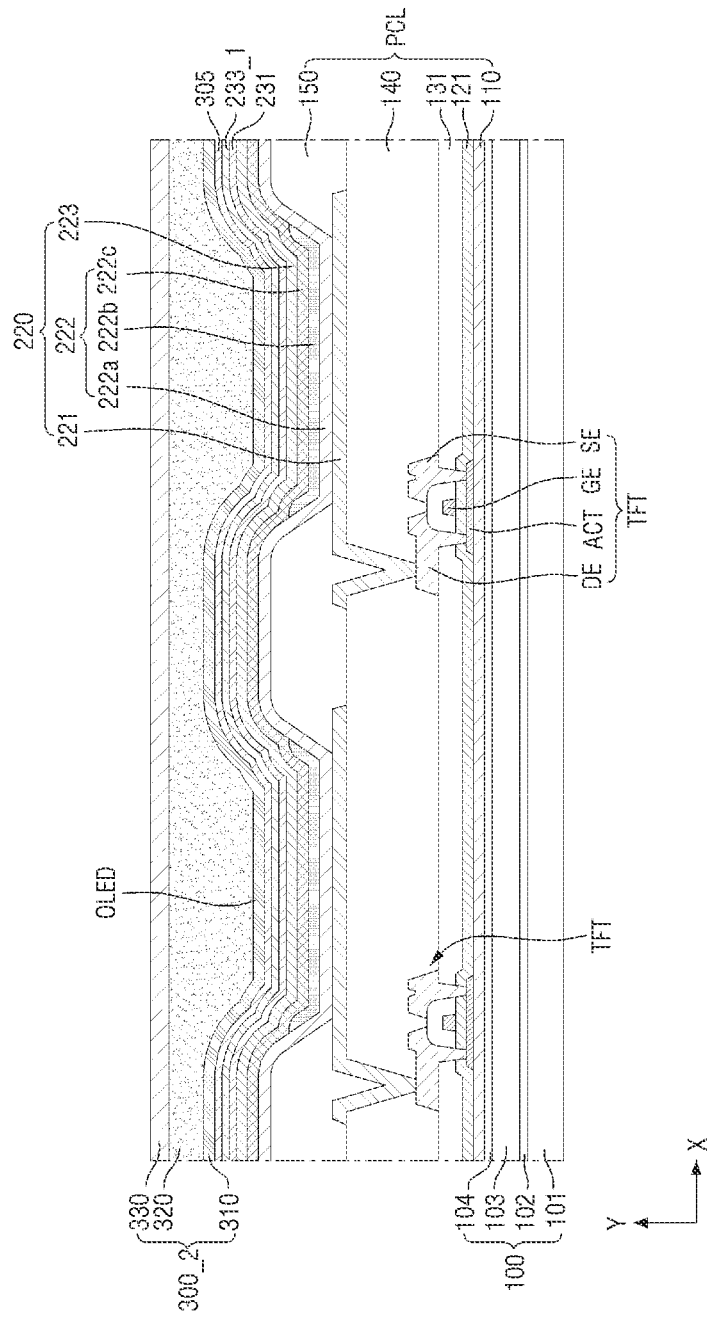
FIG. 17 is a cross-sectional view of a part of a display device according to some embodiments.
Figure 18:
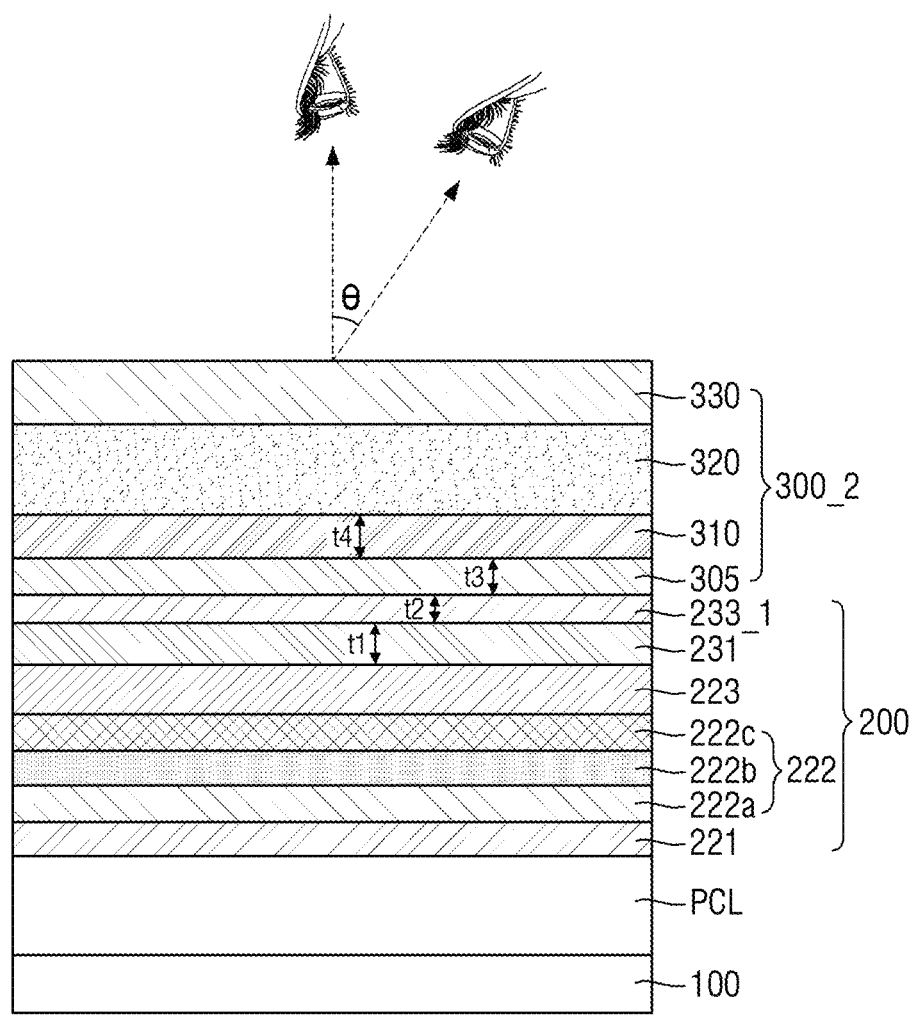
FIG. 18 is a schematic mimetic diagram of the display device of FIG. 17.

FIG. 17 is a cross-sectional view of a part of a display device according to some embodiments. FIG. 18 is a schematic mimetic diagram of the display device of FIG. 17.

Referring to FIGS. 17 and 18, the display device according to some embodiments is different from the embodiments of the display device described with respect to FIGS. 13 and 14 in that a first auxiliary layer 233_1 includes an inorganic insulating material.

For example, the first auxiliary layer 233_1 of the display device according to some embodiments may include an inorganic insulating material. Examples of the inorganic insulating material may include aluminum oxide, titanium oxide, tantalum oxide, hafnium oxide, zinc oxide, silicon oxide, silicon nitride, and silicon oxynitride. For example, the first auxiliary layer 233_1 may include silicon oxynitride.

Other details are the same as those of the display device of FIGS. 13 and 14, and thus some redundant description thereof may be omitted.

Figure 19:
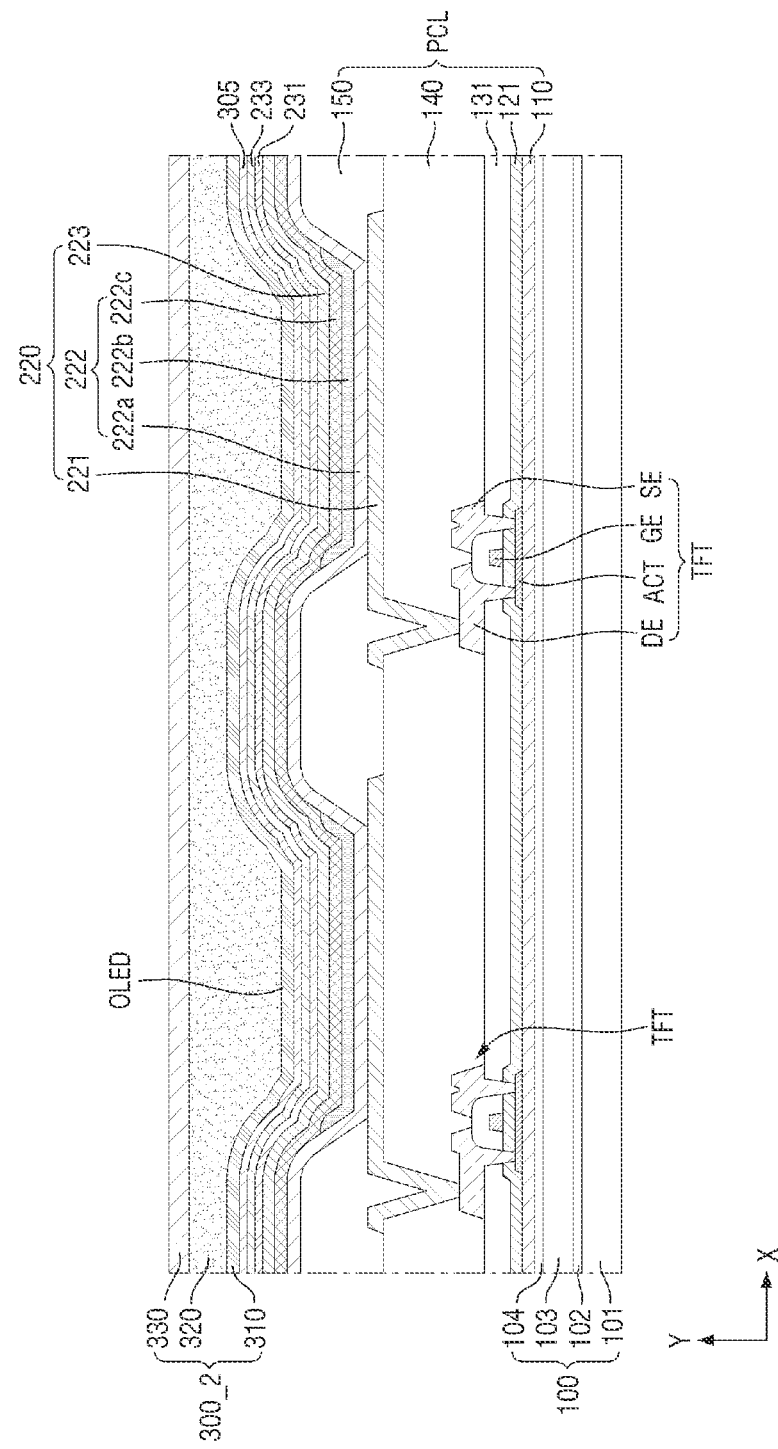
FIG. 19 is a cross-sectional view of a part of a display device according to some embodiments.
Figure 20:
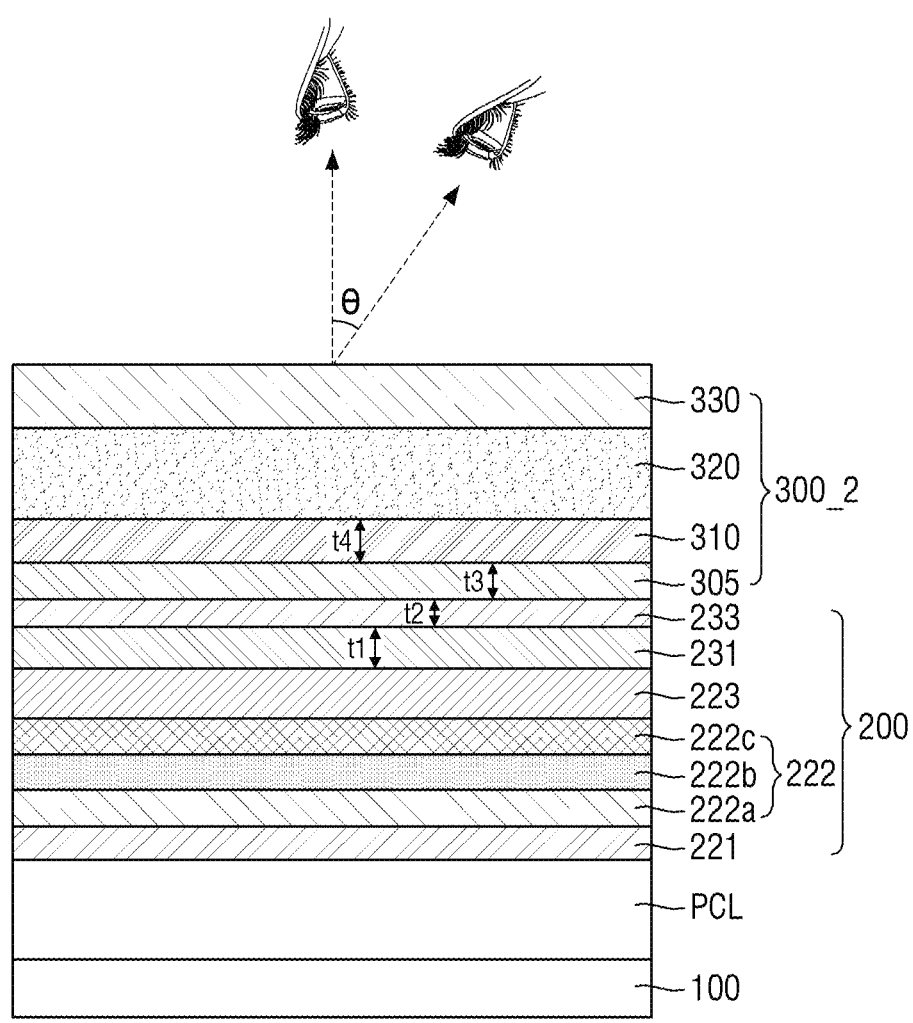
FIG. 20 is a schematic mimetic diagram of the display device of FIG. 19.

FIG. 19 is a cross-sectional view of a part of a display device according to some embodiments. FIG. 20 is a schematic mimetic diagram of the display device of FIG. 19.

Referring to FIGS. 19 and 20, the display device according to some embodiments may be different from the display device of FIGS. 17 and 18 in that a first auxiliary layer 233_1 includes lithium fluoride (LiF).

Other details are the same as those described above in FIGS. 17 and 18, and thus some redundant description thereof may be omitted.

In a display device according to some embodiments of the present disclosure, it may be possible to reduce the amount of movement in the overall color temperature direction by adjusting magnitudes of refractive indices of a capping layer, a first auxiliary layer, and at least one layer of a first inorganic encapsulation layer.

However, the effects and characteristics of embodiments according to the present disclosure are not restricted to the one set forth herein. The above and other characteristics of embodiments according to the present disclosure will become more apparent to one of daily skill in the art to which the present disclosure pertains by referencing the claims.

While embodiments according to the present disclosure have been particularly shown and described with reference to example embodiments thereof, it will be understood by those of ordinary skill in the art that various changes in form and detail may be made therein without departing from the spirit and scope of the present disclosure as defined by the following claims. Therefore, the true technical protection scope of the present disclosure will be defined by the technical spirit of the appended claims, and their equivalents.

What is claimed is:

1. A display device comprising:
a substrate;
a display element on the substrate;
a capping layer on the display element;
a first auxiliary layer on the capping layer; and
a thin-film encapsulation layer on the first auxiliary layer,
wherein the thin-film encapsulation layer comprises a
(1-1)-th inorganic encapsulation layer on the first auxiliary layer and a (1-2)-th inorganic encapsulation layer on the (1-1)-th inorganic encapsulation layer, wherein a refractive index of the first auxiliary layer is smaller than a refractive index of the capping layer and a refractive index of the (1-1)-th inorganic encapsulation layer, and a refractive index of the (1-2)-th inorganic encapsulation layer is smaller than the refractive index of the (1-1)-th inorganic encapsulation layer, wherein the thin-film encapsulation layer further comprises a buffer layer on the (1-2)-th inorganic encapsulation layer, and wherein the thin-film encapsulation layer further comprises a second auxiliary layer on the buffer layer, and a refractive index of the buffer layer is between a refractive index of the second auxiliary layer and the refractive index of the (1-2)-th inorganic encapsulation layer.

2. The display device of claim 1, wherein the refractive index of the capping layer is in a range of 1.6 to 2.3.

3. The display device of claim 1, wherein a thickness of the capping layer is in a range of 50 to 150 nm.

4. The display device of claim 1, wherein the refractive index of the first auxiliary layer is in a range of 1.2 to less than 1.6.

5. The display device of claim 1, wherein a thickness of the first auxiliary layer is in a range of 20 to 100 nm.

6. The display device of claim 1, wherein the first auxiliary layer comprises lithium fluoride (LiF) or silicon oxynitride.

7. The display device of claim 1, wherein the refractive index of the (1-1)-th inorganic encapsulation layer is in a range of 1.7 to 2.0.

8. The display device of claim 1, wherein a thickness of the (1-1)-th inorganic encapsulation layer is in a range of 100 to 200 nm.

9. The display device of claim 8, wherein the (1-1)-th inorganic encapsulation layer comprises silicon nitride or silicon oxynitride.

10. The display device of claim 1, wherein the refractive index of the (1-2)-th inorganic encapsulation layer is in a range of 1.5 to less than 1.7.

11. The display device of claim 1, wherein a thickness of the (1-2)-th inorganic encapsulation layer is 400 nm or more.

12. The display device of claim 1, wherein the (1-2)-th inorganic encapsulation layer comprises silicon oxynitride.

13. The display device of claim 1, wherein a thickness of the buffer layer is in a range of 30 to 100 nm.

14. The display device of claim 1, wherein the refractive index (n3) of the buffer layer satisfies the following condition:

$$\min(n1,n2)+|n2-n1|\times 0.25 < n3 < \min(n1,n2)+|n2-n1|\times 0.75,$$

where n1 is the refractive index of the (1-2)-th inorganic encapsulation layer, n2 is the refractive index of the second auxiliary layer, min(n1, n2) is a minimum value among n1 and n2, and |n2-n1| is an absolute value of a difference between n2 and n1.

15. The display device of claim 1, wherein the thin-film encapsulation layer further comprises an organic encapsulation layer on the second auxiliary layer and a second inorganic encapsulation layer on the organic encapsulation layer.

16. A display device comprising:
a substrate;
a display element on the substrate;
a capping layer on the display element;

a first auxiliary layer on the capping layer; and a thin-film encapsulation layer on the first auxiliary layer,
wherein the thin-film encapsulation layer comprises a first inorganic encapsulation layer, a second inorganic encapsulation layer, and an organic encapsulation layer between the first inorganic encapsulation layer and the second inorganic encapsulation layer, wherein the first inorganic encapsulation layer comprises one or more layers, and refractive indices of the capping layer, the first auxiliary layer, and the layers of the first inorganic encapsulation layer are alternately high and low, wherein the thin-film encapsulation layer further comprises a buffer layer on the second inorganic encapsulation layer, and wherein the thin-film encapsulation layer further comprises a second auxiliary layer on the buffer layer, and a refractive index of the buffer layer is between a refractive index of the second auxiliary layer and the refractive index of the second inorganic encapsulation layer.

17. The display device of claim 16, wherein the first inorganic encapsulation layer comprises a (1-1)-th inorganic encapsulation layer on the first auxiliary layer and a (1-2)-th inorganic encapsulation layer on the (1-1)-th inorganic encapsulation layer, wherein a refractive index of the first auxiliary layer is smaller than a refractive index of the capping layer and a refractive index of the (1-1)-th inorganic encapsulation layer, and a refractive index of the (1-2)-th inorganic encapsulation layer is smaller than the refractive index of the (1-1)-th inorganic encapsulation layer.

18. The display device of claim 16, wherein a coordinate value of u' at 30° is smaller than a coordinate value of u' at 0° on CIE1976 color coordinates (u', v').

19. The display device of claim 16, wherein a coordinate value of u' at 60° is larger than a coordinate value of u' at 45° on the CIE1976 color coordinates (u', v').

20. The display device of claim 12, wherein the thin-film encapsulation layer further comprises a second auxiliary layer on the (1-2)-th inorganic encapsulation layer.

21. The display device of claim 1, wherein the thin-film encapsulation layer further comprises an organic encapsulation layer on the buffer layer and a second inorganic encapsulation layer on the organic encapsulation layer.

22. A display device comprising:
a substrate;
a display element on the substrate;
a capping layer on the display element;
a first auxiliary layer on the capping layer; and
a thin-film encapsulation layer on the first auxiliary layer,
wherein the thin-film encapsulation layer comprises a first inorganic encapsulation layer, a second inorganic encapsulation layer, and an organic encapsulation layer between the first inorganic encapsulation layer and the second inorganic encapsulation layer, wherein the first inorganic encapsulation layer comprises a (1-1)-th inorganic encapsulation layer on the first auxiliary layer, and a (1-2)-th inorganic encapsulation layer on the (1-1)-th inorganic encapsulation layer, wherein a thickness of the first auxiliary layer is in a range of 20 to 100 nm, wherein a thickness of the (1-1)-th inorganic encapsulation layer is in a range of 100 to 300 nm, wherein a thickness of the (1-2)-th inorganic encapsulation layer is in a range of 400 to 2200 nm, wherein the (1-1)-th inorganic encapsulation layer comprises silicon nitride, and wherein (1-2)-th inorganic encapsulation layer comprises silicon oxynitride, wherein the thin-film encapsulation layer further comprises a buffer layer on the (1-2)-th inorganic encapsulation layer, and wherein the thin-film encapsulation layer further comprises a second auxiliary layer on the buffer layer, and a refractive index of the buffer layer is between a refractive index of the second auxiliary layer and the refractive index of the (1-2)-th inorganic encapsulation layer.

23. The display device of claim 22, wherein the first auxiliary layer comprises lithium fluoride (LiF).

24. The display device of claim 22, wherein the first auxiliary layer directly disposed on the capping layer, and
wherein a thickness of the capping layer is in a range of 50 to 150 nm.

25. The display device of claim 22, wherein the thin-film encapsulation layer further comprises an inorganic insulating layer disposed between the first inorganic encapsulation layer and the organic encapsulation layer, and
wherein a thickness of the inorganic insulating layer is in a range of 30 to 100 nm.

26. The display device of claim 25, wherein the inorganic insulating layer comprises silicon nitride.

27. The display device of claim 25, wherein the refractive index of the inorganic insulating layer is less than the refractive index of the (1-2)-th inorganic encapsulation layer.

* * * * *